United States Patent
Cho et al.

(10) Patent No.: US 10,770,270 B2
(45) Date of Patent: Sep. 8, 2020

(54) HIGH POWER ELECTROSTATIC CHUCK WITH APERTURE-REDUCING PLUG IN A GAS HOLE

(71) Applicant: APPLIED MATERIALS, INC., Santa Clara, CA (US)

(72) Inventors: Jaeyong Cho, San Jose, CA (US); Haitao Wang, Sunnyvale, CA (US); Vijay D. Parkhe, San Jose, CA (US); Kartik Ramaswamy, San Jose, CA (US); Chunlei Zhang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 456 days.

(21) Appl. No.: 15/383,124

(22) Filed: Dec. 19, 2016

(65) Prior Publication Data
US 2017/0352568 A1    Dec. 7, 2017

Related U.S. Application Data

(60) Provisional application No. 62/352,717, filed on Jun. 21, 2016, provisional application No. 62/346,802, filed on Jun. 7, 2016.

(51) Int. Cl.
*H01L 21/683*    (2006.01)
*H01T 23/00*    (2006.01)
(Continued)

(52) U.S. Cl.
CPC .. *H01J 37/32724* (2013.01); *H01J 37/32568* (2013.01); *H01J 37/32706* (2013.01);
(Continued)

(58) Field of Classification Search
CPC ............ H01L 21/6833; H01J 37/32724; H01J 37/32568; H01J 37/32706
(Continued)

(56) References Cited

U.S. PATENT DOCUMENTS 6,108,189 A * 8/2000 Weldon ............... C23C 16/4586
279/128
9,076,831 B2    7/2015 Drewery
(Continued)

FOREIGN PATENT DOCUMENTS

| JP | 2009-158917 | 7/2009 |
| JP | 2009-218592 | 9/2009 |

(Continued)

OTHER PUBLICATIONS

International Preliminary Report on Patentability from PCT/US2017/014779 dated Dec. 20, 2018, 10 pgs.
(Continued)

*Primary Examiner* — Jared Fureman
*Assistant Examiner* — Lucy M Thomas
(74) *Attorney, Agent, or Firm* — Schwabe, Williamson & Wyatt, P.C.

(57) ABSTRACT

An electrostatic chuck is described to carry a workpiece for processing such as high power plasma processing. In embodiments, the chuck includes a top plate to carry the workpiece, the top plate having an electrode to grip the workpiece, a cooling plate under the top plate to cool the top plate, a gas hole through the cooling plate and the top plate to feed a gas to the workpiece through the top plate, and an aperture-reducing plug in the cooling plate gas hole to conduct gas flow through the hole.

18 Claims, 5 Drawing Sheets

(51) Int. Cl.
*H01J 37/32* (2006.01)
*H01L 21/67* (2006.01)

(52) U.S. Cl.
CPC .. *H01J 37/32715* (2013.01); *H01L 21/67109* (2013.01); *H01L 21/6831* (2013.01)

(58) Field of Classification Search
USPC ........................................................ 361/234
See application file for complete search history.

(56) References Cited

U.S. PATENT DOCUMENTS

| | | | |
|---|---|---|---|
| 9,627,240 | B2 | 4/2017 | Yamaguchi et al. |
| 2006/0207507 | A1* | 9/2006 | Oohashi ............ H01J 37/32724 118/725 |
| 2009/0086400 | A1 | 4/2009 | Samir et al. |
| 2010/0109263 | A1 | 5/2010 | Jun et al. |
| 2010/0326602 | A1 | 12/2010 | Bluck et al. |
| 2011/0024049 | A1 | 2/2011 | Stevenson et al. |
| 2013/0088808 | A1 | 4/2013 | Parkhe et al. |
| 2013/0105087 | A1 | 5/2013 | Cho et al. |
| 2014/0376148 | A1 | 12/2014 | Sasaki et al. |
| 2015/0183187 | A1 | 7/2015 | Lin et al. |
| 2015/0279714 | A1 | 10/2015 | Yamaguchi et al. |
| 2015/0332942 | A1* | 11/2015 | Peh .................. H01L 21/67109 165/253 |
| 2016/0111314 | A1 | 4/2016 | Kimball et al. |
| 2016/0276198 | A1 | 9/2016 | Anada et al. |

FOREIGN PATENT DOCUMENTS

| | | |
|---|---|---|
| JP | 2010-123712 | 6/2010 |
| JP | 2014-209615 | 11/2014 |
| JP | 2014-534614 | 12/2014 |
| KR | 10-2009-0097797 | 9/2009 |
| KR | 10-2015-0096492 | 8/2015 |
| TW | 201438141 | 10/2014 |
| WO | WO 2014/182711 | 11/2014 |

OTHER PUBLICATIONS

PCT International Search Report and Written Opinion of the International Searching Authority for International Application No. PCT/US2017/014779, dated May 2, 2017, 12 pages.
Notice of Reasons for Rejection from Japanese Patent Application No. 2018-563555 dated Dec. 19, 2019, 6 pgs.
Office Letter from Taiwan Patent Application No. 106103139 dated Apr. 15, 2020, 16 pgs.
Notice to File a Response (Preliminary Rejection) from Korean Patent Application No. 10-2018-7038147 dated Jun. 2, 2020, 10 pgs.

* cited by examiner

HIGH POWER ELECTROSTATIC CHUCK WITH APERTURE-REDUCING PLUG IN A GAS HOLE

CROSS-REFERENCE TO RELATED APPLICATIONS

The present application claims priority to prior U.S. Provisional Application Ser. No. 62/352,717 filed Jun. 21, 2016, entitled HIGH POWER ESC DESIGN WITH POROUS THROUGH HOLE IN A COOLING PLATE by Jaeyong Cho, et al., the priority of which is hereby claimed and U.S. Provisional Application Ser. No. 62/346,802 filed Jun. 7, 2016, entitled HIGH POWER ESC DESIGN WITH POROUS THROUGH HOLE IN A COOLING PLATE by Jaeyong Cho, et al., the priority of which is hereby claimed.

FIELD

The present description relates to an electrostatic chuck to carry a workpiece for semiconductor and micromechanical processing and in particular to an internal porous through hole in the chuck.

BACKGROUND

In the manufacture of semiconductor chips, a silicon wafer or other substrate is exposed to a variety of different processes in different processing chambers. The chambers may expose the wafer to a number of different chemical and physical processes whereby minute integrated circuits are created on the substrate. Layers of materials which make up the integrated circuit are created by processes including chemical vapor deposition, physical vapor deposition, epitaxial growth, and the like. Some of the layers of material are patterned using photoresist masks and wet or dry etching techniques. The substrates may be silicon, gallium arsenide, indium phosphide, glass, or other appropriate materials.

In these manufacturing processes, plasma may be used for depositing or etching various material layers. Plasma processing offers many advantages over thermal processing. For example, plasma enhanced chemical vapor deposition (PECVD) allows deposition processes to be performed at lower temperatures and at higher deposition rates than in analogous thermal processes. PECVD therefore allows material to be deposited at lower temperatures.

The processing chambers used in these processes typically include a substrate support, pedestal, or chuck disposed therein to support the substrate during processing. In some processes, the pedestal may include an embedded heater adapted to control the temperature of the substrate and/or provide elevated temperatures that may be used in the process.

HAR (High Aspect Ratio) plasma etch uses a significantly higher bias power to achieve bending free profiles. In order to support HAR for dielectric etching, the power may be increased to 20 KW, which brings significant impacts on an ESC (Electrostatic Chuck). Many current ESC designs cannot survive such a high voltage which comes as a direct result of a high bias power. Holes designed into an ESC may suffer in particular. Moreover, an ESC may experience bond failures in the lift pin area when excess radicals erode the bonds. Another impact is that the ESC surface temperature changes at a higher rate. The heating of the ESC surface is directly proportional to the applied RF plasma power. The heat may also be a result of bond failure. In addition bowing of the wafer carried on the ESC and the charge build up on the wafer also makes wafer de-chucking more difficult.

Common processes use an ESC to hold a wafer with 2 MHz 6.5 KW plasma power applied to the wafer for etching applications. High aspect ratio (e.g. 100:1) applications use much higher plasma powers. An ESC is described herein that operates with a low frequency high power plasma voltage to generate a high wafer bias. The higher power will increase failures of the ESC due to the dielectric breaking down and due to plasma ignition in gas holes that are designed into the ESC.

SUMMARY

An electrostatic chuck is described to carry a workpiece for processing such as high power plasma processing. In embodiments, the chuck includes a top plate to carry the workpiece, the top plate having an electrode to grip the workpiece, a cooling plate under the top plate to cool the top plate, a gas hole through the cooling plate and the top plate to feed a gas to the workpiece through the top plate, and an aperture-reducing plug in the cooling plate gas hole to conduct gas flow through the hole.

BRIEF DESCRIPTION OF THE DRAWINGS

Embodiments of the present invention are illustrated by way of example, and not limitation, in the figures of the accompanying drawings in which.

DETAILED DESCRIPTION

The described ESC withstands high power and high bias voltages. The described inventive ESC uses a porous plug in the cooling plate for preventing plasma light-up in a helium (He) hole. The helium hole delivers helium for backside wafer cooling. Many ESC's use a separate channel near the center of the top puck to deliver helium to the backside of the wafer for cooling. The He is applied at pressure at the bottom of the ESC and is pushed up through the top plate or puck of the ESC to the space between the puck and the wafer back side. The He holes may experience arcing under high voltage (RF power). As described herein the arcing in the He holes in the ESC may be reduced or eliminated.

Figure 1:
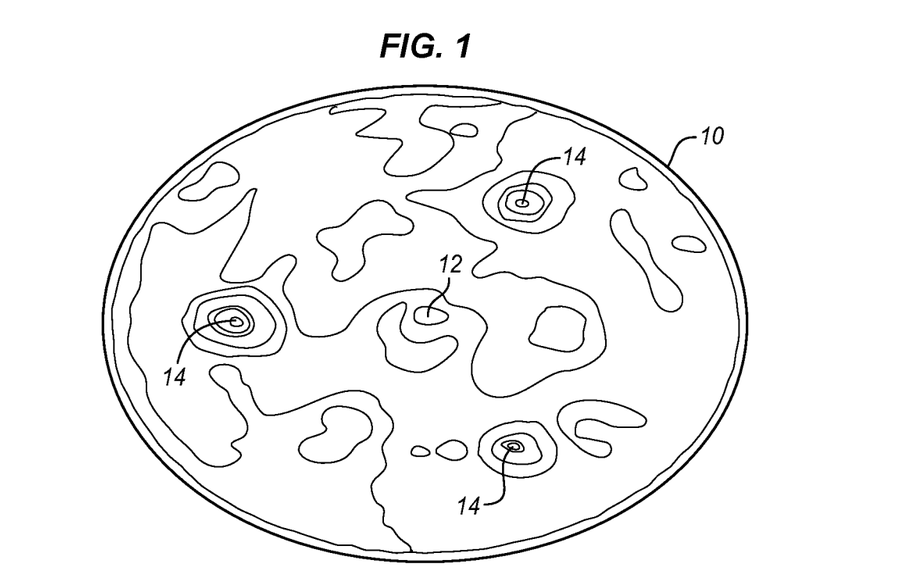
FIG. 1 is a diagram of a thermal image of an ESC during a process in a plasma processing chamber in accordance with an embodiment of the invention.

FIG. 1 is a diagram of a thermal image of an ESC 10 during a process in a plasma processing chamber. The central spot 12 corresponds to the location of the helium cooling gases hole and the three peripheral spots 14 correspond to the location of the lift pin holes. As shown, the three lift pin areas get hotter because the bond is eroded locally. There are issues with the wafer processes in these hot spots and the bond between the puck and the support plate is eroded around the hot spots (lift pins). Pumping He through the central gas hole pushes gas across the back side of the wafer to the periphery in order to reduce the temperature differences at these locations and other locations. The pumped gas also reduces the presence of radicals near the back side of the wafer which tends to erode the bonding materials that hold the top plate to the rest of the ESC. He is a suitable gas to be applied through the central gas hole 12 because of its electrical characteristics and thermal conductivity.

Figure 2:
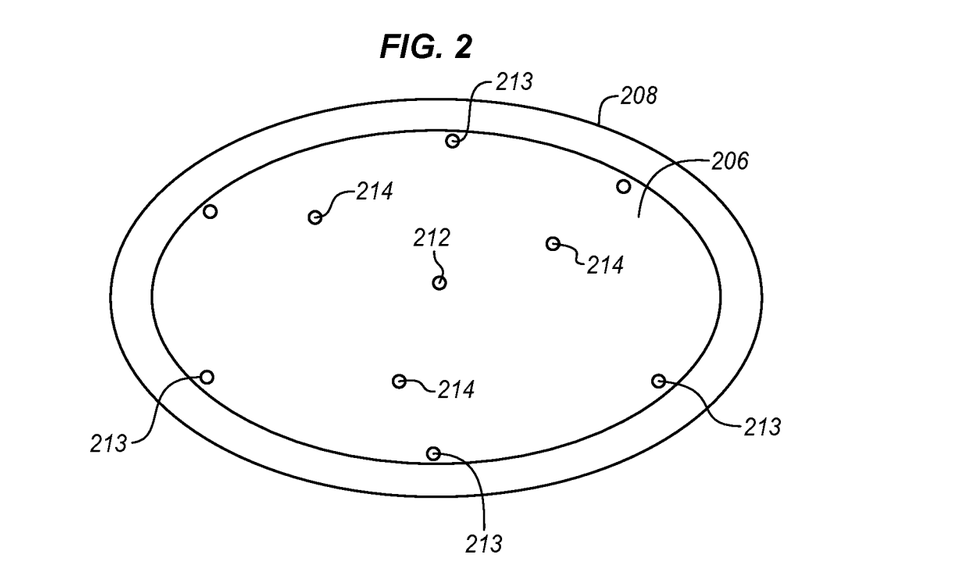
FIG. 2 is a top view diagram of a puck on a top plate of an ESC in accordance with an embodiment of the invention.

FIG. 2 is a top view diagram of a puck 206 on a top plate of an ESC. The puck may have inner electrodes to hold a wafer (not shown). The electrode is beneath a dielectric layer and is sized to be almost the same size as the wafer that it will hold. The electrode is electrically connected to a DC voltage source.

The central gas hole 212 may be joined by a further array of peripheral gas holes 213 and an array of lift pin holes 214. The gas holes allow additional cooling gas to be pushed out to the space between the wafer and the puck. The lift pin holes allow lift pins to extend through the holes to push a wafer off the chuck (de-chucking) so that the wafer maybe removed for other or additional processing. There may be additional holes and other structures to perform other functions. Heaters, cooling channels, plasma process structures and other components are not shown in order not to obscure the drawing figure.

Figure 3:
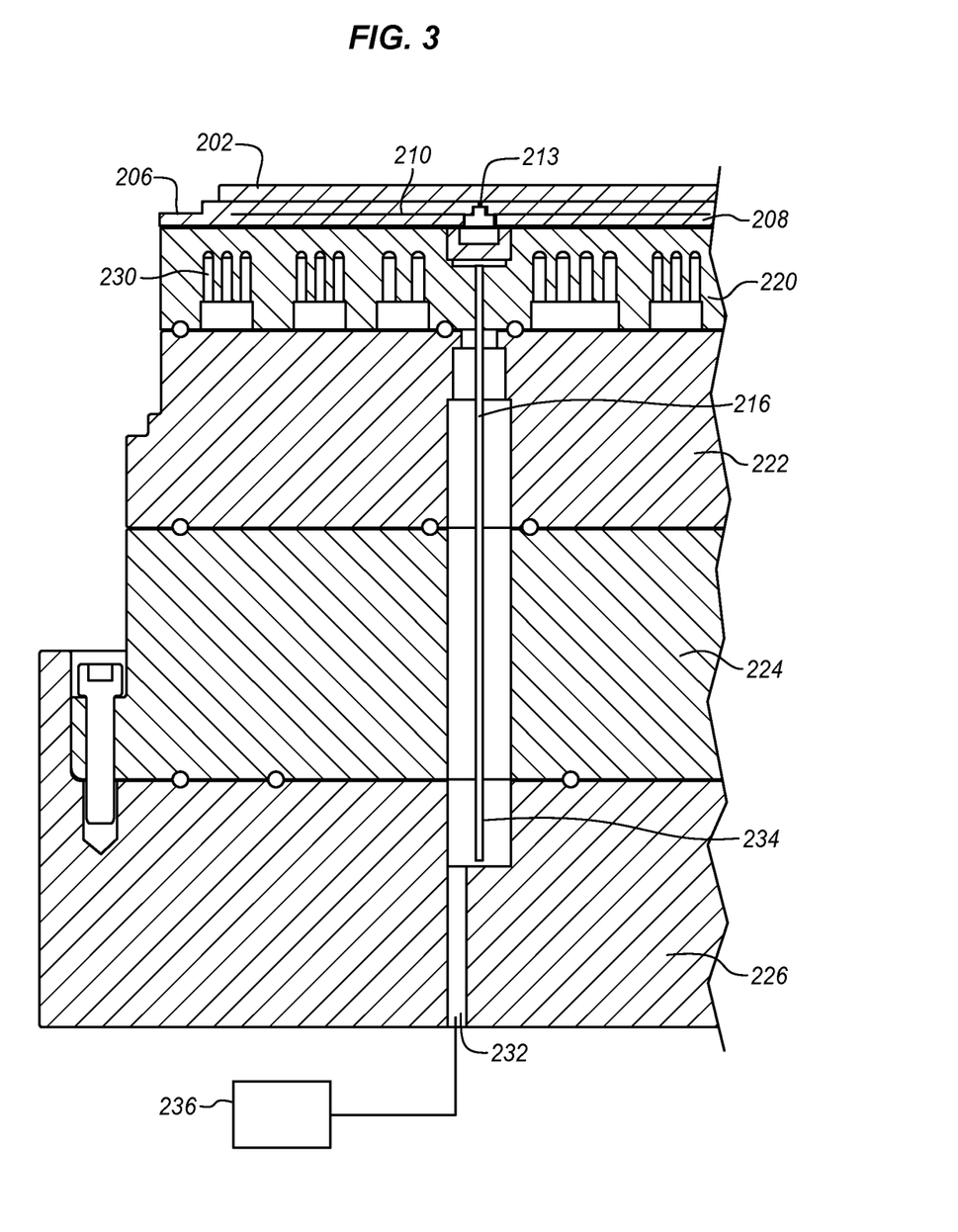
FIG. 3 is a partial cross-sectional side view diagram of an ESC showing the top layer and puck in accordance with an embodiment of the invention.

FIG. 3 is a partial cross-sectional side view diagram of an ESC showing the top layer 208 and puck 206 of FIG. 2. The top plate is configured to carry a workpiece 202 such as a silicon wafer or other item. The workpiece, in this example is held by an electrostatic force generated by electrodes 210 in the top plate. The top plate is formed of a dielectric material such as a ceramic, for example aluminum nitride, and is mounted to a base plate 220 using, for example, an adhesive. The base or cooling plate may be formed of any suitable material, such as aluminum, to support the top plate. The base plate may contain cooling channels 230, wiring layers, pipes, tubes, and other structures (not shown) to support the puck and a wafer 202 that is attached to and carried by the puck.

The base plate is supported by a ground plate 224 that is carried by a support plate 226. An insulation plate 222 formed of an electrical and thermal isolator such as Rexolite®, or another plastic or polystyrene, heat resistant material to isolate the base cooling plate from the lower ground and support plates. The bottom support plate provides fittings for electrical and gas connections and provides attachment points for carriers and other fittings.

The gas hole 213 extends through the top plate 208, the base plate 220, the insulation plate 222, the ground plate 224 and the support plate 226 to connect to a gas line 232 that supplies gas under pressure. The gas is supplied to the gas line by a regulated cooling gas source 236 such as a tank and pump or any other type of source. As mentioned above, the cooling gas may be helium, nitrogen, or any other suitable inert gas with a high thermal conductivity. Any of the gas holes whether central or peripheral may have the same or a similar appearance and the illustrated hole represents either type.

Figure 4:
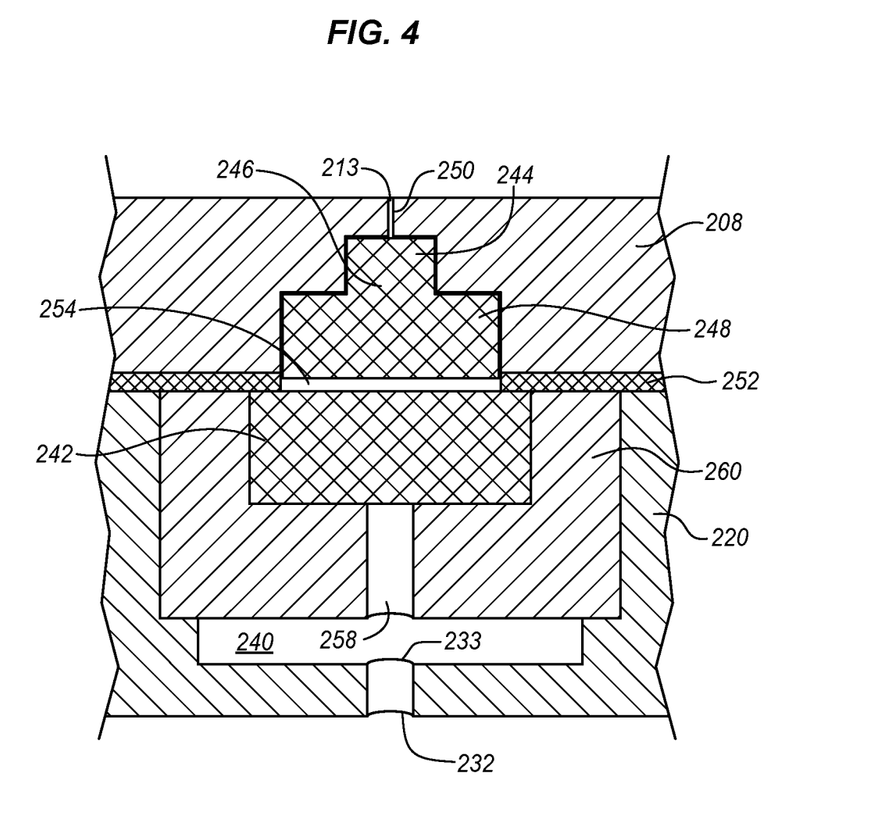
FIG. 4 is a partial cross-sectional side view diagram of a gas hole in the base plate and the top plate with a plug in a base plate hole in accordance with an embodiment of the invention.

FIG. 4 is an enlarged partial cross-sectional side view diagram of the gas hole 213 in the base plate 222 or cooling plate and the top plate 208. The dielectric puck 208 is attached to the conductive cooling plate 220 using an adhesive 252. The base plate has a dielectric coating on the top surface between it and the adhesive. This reduces any arcing between the base plate and the top plate. The puck supports the workpiece (not shown) such as a wafer during plasma processing and other processes. In some embodiments, the cooling plate has a DC voltage applied to reduce the voltage potential between the puck and the cooling plate. The center of the cooling plate has a fitting for a gas line 232 which extends through a hole 233 in the cooling plate through which the cooling gas is provided from below the cooling plate into a gas channel 240 in the cooling plate. The gas channel is covered by a solid cover 260 that is attached over the channel. The cover may be aluminum like the cooling plate that is e-beam welded in place. The channel is open to a hole 258 through the cover 260 that feeds the gas into a first porous plug 242 in the cooling channel. The porous plug in the cooling channel conducts the gas into a second porous plug 246 in the puck. The porous plug in the puck couples the gas under pressure into a central hole 250 through the top of the puck toward the wafer back side. If there are more cooling gas holes, then the channel may extend to those holes with corresponding holes in the cover to pass gas through to corresponding porous plugs.

These cavities in the base plate and in the puck are all prone to arcing. A negative voltage is coupled to the wafer to cause ion bombardment from a vapor or plasma onto the wafer. The negative voltage generates a strong e-field between the wafer and the cooling plate including the cavities into which helium is introduced. Due to this high e-field, some of the helium can be ignited and the RF power that is applied to the ESC concentrates where the helium is ignited. This can cause severe arcing events there. The same phenomenon occurs with other types of thermal coupling gases in addition to helium, such as nitrogen, argon, etc.

The plug 242 in the cooling plate reduces the aperture through which the gas flows. This reduces or eliminates the arcing in the cooling plate. To provide cooling, the cooling plate 220 is typically made from a thermally conductive material, such as aluminum. This allows the cooling plate to absorb heat from the puck and channel it to coolant channels 230. Thermally conductive materials are often also electrically conductive which allows the voltage on the workpiece and the puck to be conducted to the cooling plate. This voltage is then able to induce arcing in the gas cavities.

The gas channel and the hole and the gas line sidewalls in the cooling plate may be covered with a dielectric coating such as aluminum nitride or yttria. This helps to protect against gas arcing and provides an electrical transition from the conductive cooling plate to the aperture-reducing plug. The increase in dielectric in the otherwise thermally conducting cooling plate helps to allow for higher external plasma and bias voltages without arcing in the holes of the cooling plate. If the plug 242 is also dielectric, then it overcomes the electrical conductivity of the cooling plate. In addition to being porous to allow flow, the aperture-reducing plug may optionally have a central vertical tube (not shown) to allow a higher gas flow. The porosity of the plug allows additional gas flow around the central tube, conducting gas flow through the cooling plate hole into the puck. More specifically, the central tube and porous material allow a thermal gas, such as helium, to flow through the porous plug from the cooling plate 220 into the porous plug 246 in the top plate 208. In some embodiments, there is no central tube and the helium, or any other thermal conducting gas, flows through the porous areas of the plug.

This additional aperture-reducing plug 242 in the cooling plate reduces the e-field density created between the wafer and cooling plate where helium is introduced for heat transfer between the wafer and the ESC top surface.

The porous plug in the top plate has a tapered shape to guide the gas to the gas hole 213. The base 248 of the top plate plug 246 is narrower or about the same size as the top of the plug 242 in the cooling plate. The top 244 of the top plate plug is narrower than the base and it guides the gas into an upper central hole 250 through the top of the top plate that leads to the gas hole 213. The gas hole is placed close to the back side of the workpiece to promote thermal conduction between the workpiece and the top plate. While the plug 246 is shown as having a stepped shape with a narrower diameter after the step, the plug may have multiple steps, a narrowing conical diameter, or a combination or different tapering effects.

As shown, the cooling plate aperture-reducing plug 242 is placed into a larger channel 240. These are both shown as cylindrical but may take any desired shape depending on the desired gas flow and the direction and propagation of the gas flow. The plug is about half the diameter of the channel and is placed against the top of the channel closest to the top plate. The plug may be attached to the channel walls with a suitable adhesive. There is an opening 254 in the channel 240 above the plug 242 to allow the gas to flow from the cooling plate plug into the top plate plug 246. This opening may be as large as the top plate plug, as shown, or smaller.

The two porous plugs may be made from the same or a different porous dielectric material. A variety of different ceramics may be used, however, there may also be other suitable materials. As examples, the plugs may be made of porous ceramic materials, such as aluminum nitride (AlN) aluminum oxide ($Al_2O_3$), polyetheretherketone (PEEK), VELSEL®, or any other suitable material. The porosity of the material is selected to allow a desired gas flow rate during use. If the porosity is not enough to provide a sufficient gas flow rate, then one or more small vertical tubes may be drilled through the plug.

Figure 5:
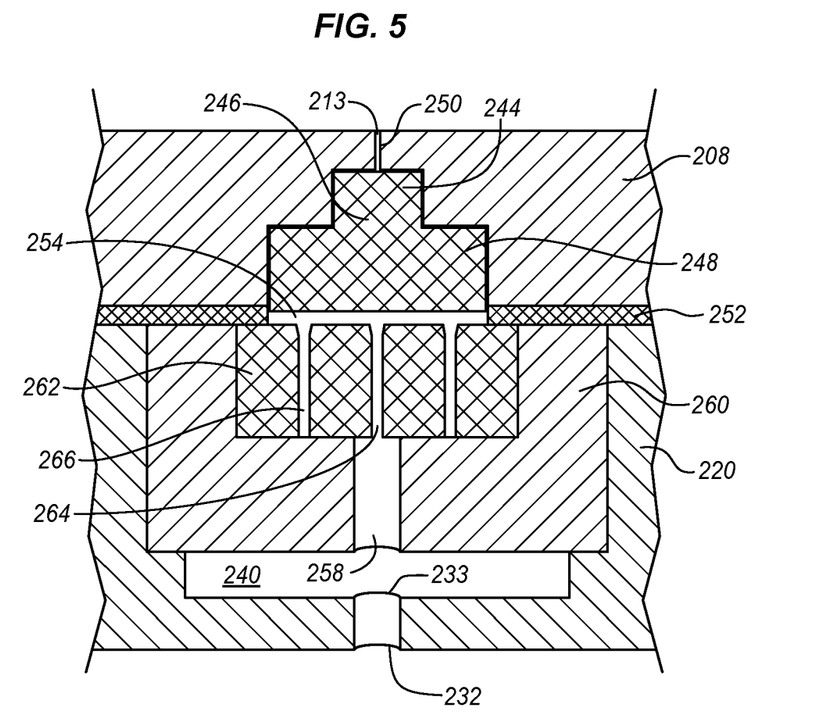
FIG. 5 is a partial cross-sectional side view diagram of a gas hole in the base plate and the top plate with an alternative plug in a base plate hole in accordance with an embodiment of the invention.

FIG. 5 is an enlarged partial cross-sectional side view diagram of the gas hole 213 in the base plate 222 and the top plate 208 with an alternative flow and space-restricting aperture-reducing plug in the cooling plate. The bottom porous plug 242 of FIG. 4 in the cooling plate can be replaced with any dielectric insert such as alumina, AlN or plastics. The plug has at least one tube in it or the cooling gas flows through the pores. The plug reduces the gas breakdown voltage but improves gas flow conduction making the gas stabilization time and the gas dumping time shorter.

In the example of FIG. 5, however, the porous plug 242 is replaced with an alumina or other dielectric solid aperture-reducing plug 262. Any other dielectric amorphous, polymer, or other non-porous material may be used including various ceramics. The plug has a central tube 264 to allow the flow of the cooling gas. It may also have additional vertical tubes 266 to the side of the central tube to allow a higher total flow rate. The sizes of the tubes may be selected to suit different temperature and plasma voltage conditions as well as to suit different gas flow rates. A higher voltage may require a smaller tube to effectively reduce the gas breakdown voltage.

As in the example of FIG. 4, the dielectric puck 208 is attached to the conductive cooling plate 220 using an adhesive 252. The center of the cooling plate has a fitting for a gas line 232 through which the cooling gas is provided from below the cooling plate through a passage 233 in the cooling plate into a channel 240 in the cooling plate. The channel feeds the gas through a hole 258 in the channel cover 260 into a lower solid aperture-reducing plug 262 in the cooling channel. The solid plug in the cooling channel couples the gas through one more tubes into an upper porous plug 246 in the puck. The porous plug in the puck couples the gas under pressure into a central hole 250 through the top of the puck toward the wafer back side. As alternatives, the upper plug may be removed or take any of a variety of different forms.

Figure 6:
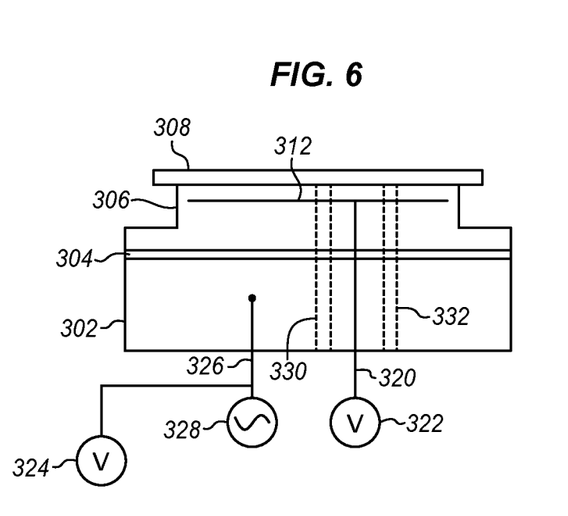
FIG. 6 is a cross-sectional side view diagram of an electrostatic chuck with a voltage applied to the cooling plate in accordance with an embodiment of the invention.

FIG. 6 is a cross-sectional side view diagram of an electrostatic chuck with an electrode in the top puck. In the illustrated example, the chuck is an ESC with an Al cooling or base plate 302. The other plates of FIG. 3 are not shown in order to simplify the drawing. Alternatively, these other plates may be deleted to better suit particular applications. A puck 306 is bonded to the base plate with a layer of dielectric adhesive 304. The adhesive attenuates electric and thermal conduction between the puck and the base plate. The puck is made of ceramic or another dielectric. The puck holds a workpiece, such as a wafer 308 using an electrostatic force. The workpiece has been referred to herein as a wafer, although the chuck may carry other workpieces for a variety of different products and processes. The diagram is simplified so as not to obscure the features of the invention.

Figure 7:
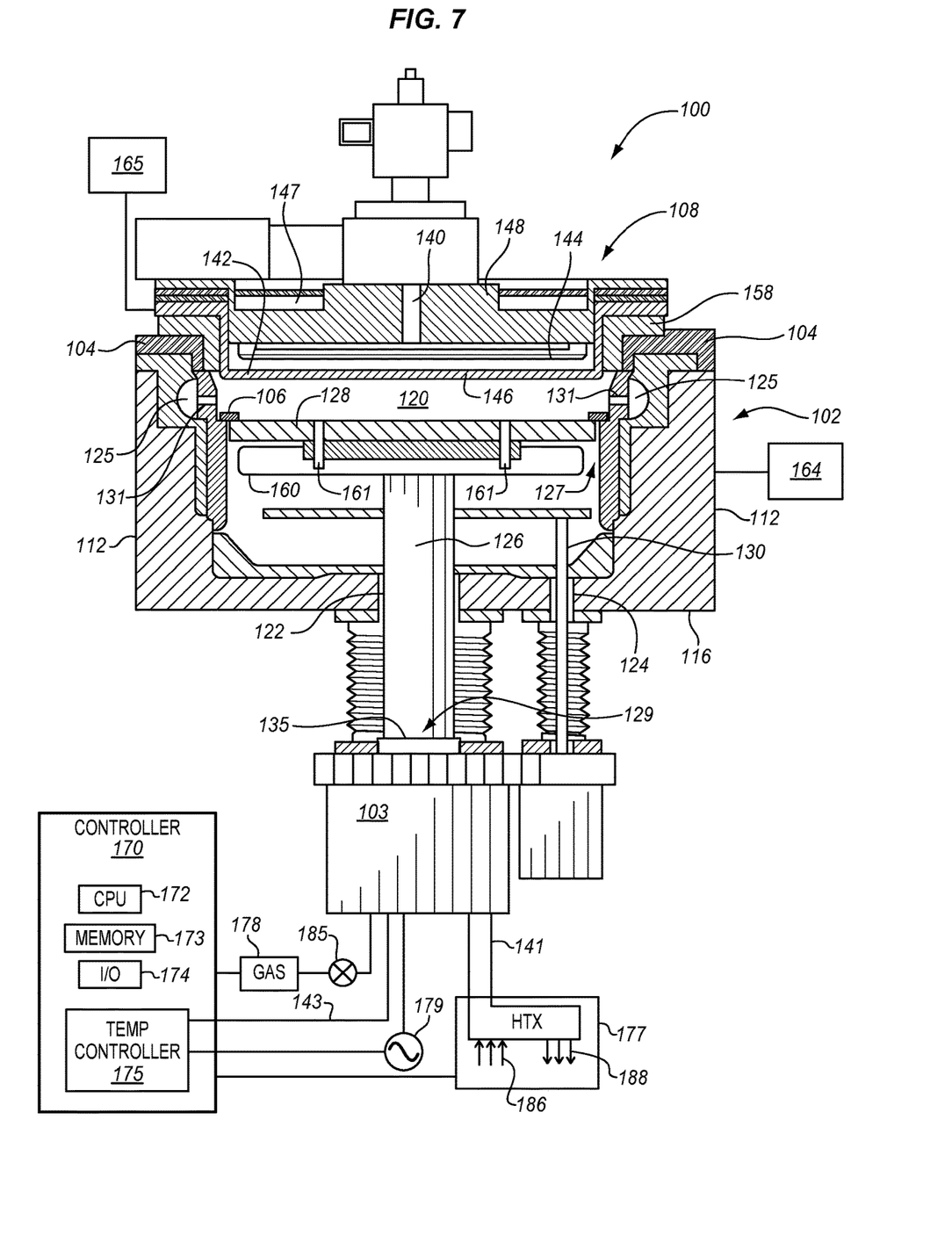
FIG. 7 is a diagram of a plasma etch system including a workpiece carrier in accordance with an embodiment of the present invention.

The base plate may contain many other components, features, and external connections for thermal fluid, gas flow, heater power, sensors, and other components including those shown in FIGS. 3 and 7. Similarly the puck may include heaters, sensors, liquid and gas flow channels and other features that are connected through the base plate to external components. There may be additional plates below the illustrated base plate for physical support and to carry some of these other components. While there may be many other additional features, there may be a single central tube 330 through the chuck base plate and top plate to carry a cooling and thermal conduction gas such as helium through the chuck from the back side of the wafer. There may be additional gas holes and other holes. Additional holes 332 through the base plate and wafer may provide for lift pins, for example, to push the wafer off the chuck for de-chucking. The holes may have aperture restricting plugs (not shown) as described above that are either solid or porous.

The electrostatic force to hold the wafer 308 is generated using an electrode 312, such as a mesh of wires or a plate near the top surface of the puck that is charged by applying a voltage from an external power supply 322 to the wire mesh through an electrical connector or rod 320 through the base plate and the puck. While only one connector is shown, there may be multiple connectors and there may be different polarities to different sections of the electrode. The external power supply may be an AC (Alternating Current) or DC (Direct Current) power source or both. In some embodiments DC is applied to create an electrostatic charge on the electrode to grip the wafer. AC may be used for the same purpose but may also be used to induce a bias voltage on the wafer and induce ion bombardment from the plasma onto the wafer.

The wire mesh 312 appears as a line near the wafer in this cross-sectional side view. In a top view, the mesh is a web of usually orthogonal crossing wires that covers most of the area near the top surface of the puck. The wires may be copper, aluminum, or molybdenum. Alternatively, the wire mesh may be a solid or mostly solid conducting plate embedded in the puck. The plate may be in several parts to apply different electrostatic polarities or amounts of charge. The mesh 312 may be formed by screen printing, deposition, or spinning. Alternatively, conductive plate may be separately cast or machined and then placed into the top plate as the top plate is formed.

The base plate 302 is also coupled to a DC power supply 324 through an electrical connector 326. An RF power supply 328 may also be coupled to the base plate 302 using the electrical connector 326. The RF power supply 328 may be the same as or different from either or both of the DC voltage source 322, 324. The power supplied to the cooling plate serves to further reduce the plasma light up potential in the cooling gas hole 330, 332 in the cooling plate by applying a voltage to the cooling plate.

The voltage on the cooling plate may be selected to correspond to the voltage on the wafer. If the voltage on the wafer is negative, then the voltage applied to the cooling plate may be negative. The negative voltage reduces the potential difference between the wafer and the cooling plate. This reduces the e-field density in the gas hole.

As an example, with a DC voltage bias of −4 kV induced on the wafer by the RF plasma, there will be a potential difference of 4 kV or more between the wafer and the base plate. The difference may be more if the voltage of the base plate is allowed to float. On the other hand, by applying a voltage of about −2 kV to the base plate, the potential difference may be reduced by half to about 2 kV. Any other negative voltage may be used and −2 kV is provided as an example. For typical RF plasma processes the wafer is biased negatively with respect to the bias RF power applied to the cooling plate. This applied DC voltage also reduces the e-field in the puck between the base plate and the wafer.

FIG. 7 is a partial cross sectional view of a plasma system 100 having a pedestal 128 according to embodiments described herein. The pedestal 128 has an active cooling system which allows for active control of the temperature of a substrate positioned on the pedestal over a wide temperature range while the substrate is subjected to numerous process and chamber conditions. The plasma system 100 includes a processing chamber body 102 having sidewalls 112 and a bottom wall 116 defining a processing region 120.

A pedestal, carrier, chuck or ESC 128 is disposed in the processing region 120 through a passage 122 formed in the bottom wall 116 in the system 100. The pedestal 128 is adapted to support a substrate (not shown) on its upper surface. The substrate may be any of a variety of different workpieces for the processing applied by the chamber 100 made of any of a variety of different materials. The pedestal 128 may optionally include heating elements (not shown), for example resistive elements, to heat and control the substrate temperature at a desired process temperature. Alternatively, the pedestal 128 may be heated by a remote heating element, such as a lamp assembly.

The pedestal 128 is coupled by a shaft 126 to a power outlet or power box 103, which may include a drive system that controls the elevation and movement of the pedestal 128 within the processing region 120. The shaft 126 also contains electrical power interfaces to provide electrical power to the pedestal 128. The power box 103 also includes interfaces for electrical power and temperature indicators, such as a thermocouple interface. The shaft 126 also includes a base assembly 129 adapted to detachably couple to the power box 103. A circumferential ring 135 is shown above the power box 103. In one embodiment, the circumferential ring 135 is a shoulder adapted as a mechanical stop or land configured to provide a mechanical interface between the base assembly 129 and the upper surface of the power box 103.

A rod 130 is disposed through a passage 124 formed in the bottom wall 116 and is used to activate substrate lift pins 161 disposed through the pedestal 128. The substrate lift pins 161 lift the workpiece off the pedestal top surface to allow the workpiece to be removed and taken in and out of the chamber, typically using a robot (not shown) through a substrate transfer port 160.

A chamber lid 104 is coupled to a top portion of the chamber body 102. The lid 104 accommodates one or more gas distribution systems 108 coupled thereto. The gas distribution system 108 includes a gas inlet passage 140 which delivers reactant and cleaning gases through a showerhead assembly 142 into the processing region 120B. The showerhead assembly 142 includes an annular base plate 148 having a blocker plate 144 disposed intermediate to a faceplate 146.

A radio frequency (RF) source 165 is coupled to the showerhead assembly 142. The RF source 165 powers the showerhead assembly 142 to facilitate generation of plasma between the faceplate 146 of the showerhead assembly 142 and the heated pedestal 128. In one embodiment, the RF source 165 may be a high frequency radio frequency (HFRF) power source, such as a 13.56 MHz RF generator. In another embodiment, RF source 165 may include a HFRF power source and a low frequency radio frequency (LFRF) power source, such as a 300 kHz RF generator. Alternatively, the RF source may be coupled to other portions of the processing chamber body 102, such as the pedestal 128, to facilitate plasma generation. A dielectric isolator 158 is disposed between the lid 104 and showerhead assembly 142 to prevent conducting RF power to the lid 104. A shadow ring 106 may be disposed on the periphery of the pedestal 128 that engages the substrate at a desired elevation of the pedestal 128.

Optionally, a cooling channel 147 is formed in the annular base plate 148 of the gas distribution system 108 to cool the annular base plate 148 during operation. A heat transfer fluid, such as water, ethylene glycol, a gas, or the like, may be circulated through the cooling channel 147 such that the base plate 148 is maintained at a predefined temperature.

A chamber liner assembly 127 is disposed within the processing region 120 in very close proximity to the sidewalls 101, 112 of the chamber body 102 to prevent exposure of the sidewalls 101, 112 to the processing environment within the processing region 120. The liner assembly 127 includes a circumferential pumping cavity 125 that is coupled to a pumping system 164 configured to exhaust gases and byproducts from the processing region 120 and control the pressure within the processing region 120. A plurality of exhaust ports 131 may be formed on the chamber liner assembly 127. The exhaust ports 131 are configured to allow the flow of gases from the processing region 120 to the circumferential pumping cavity 125 in a manner that promotes processing within the system 100.

A system controller 170 is coupled to a variety of different systems to control a fabrication process in the chamber. The controller 170 may include a temperature controller 175 to execute temperature control algorithms (e.g., temperature feedback control) and may be either software or hardware or a combination of both software and hardware. The system controller 170 also includes a central processing unit 172, memory 173 and input/output interface 174. The temperature controller receives a temperature reading 143 from a sensor (not shown) on the pedestal. The temperature sensor may be proximate a coolant channel, proximate the wafer, or placed in the dielectric material of the pedestal. The temperature controller 175 uses the sensed temperature or temperatures to output control signals affecting the rate of heat transfer between the pedestal assembly 142 and a heat source and/or heat sink external to the plasma chamber 105, such as a heat exchanger 177.

The system may also include a controlled heat transfer fluid loop 141 with flow controlled based on the temperature feedback loop. In the example embodiment, the temperature controller 175 is coupled to a heat exchanger (HTX)/chiller 177. Heat transfer fluid flows through a valve (not shown) at a rate controlled by the valve through the heat transfer fluid loop 141. The valve may be incorporate into the heat exchanger or into a pump inside or outside of the heat exchanger to control the flow rate of the thermal fluid. The heat transfer fluid flows through conduits in the pedestal assembly 142 and then returns to the HTX 177. The temperature of the heat transfer fluid is increased or decreased by the HTX and then the fluid is returned through the loop back to the pedestal assembly.

The HTX includes a heater 186 to heat the heat transfer fluid and thereby heat the substrate. The heater may be formed using resistive coils around a pipe within the heat exchanger or with a heat exchanger in which a heated fluid conducts heat through an exchanger to a conduit containing the thermal fluid. The HTX also includes a cooler 188 which draws heat from the thermal fluid. This may be done using a radiator to dump heat into the ambient air or into a coolant fluid or in any of a variety of other ways. The heater and the cooler may be combined so that a temperature controlled fluid is first heated or cooled and then the heat of the control fluid is exchanged with that of the thermal fluid in the heat transfer fluid loop.

The valve (or other flow control devices) between the HTX 177 and fluid conduits in the pedestal assembly 142 may be controlled by the temperature controller 175 to control a rate of flow of the heat transfer fluid to the fluid loop. The temperature controller 175, the temperature sensor, and the valve may be combined in order to simplify construction and operation. In embodiments, the heat exchanger senses the temperature of the heat transfer fluid after it returns from the fluid conduit and either heats or cools the heat transfer fluid based on the temperature of the fluid and the desired temperature for the operational state of the chamber 102.

Electric heaters (not shown) may also be used in the pedestal assembly to apply heat to the pedestal assembly. The electric heaters, typically in the form of resistive elements are coupled to a power supply 179 that is controlled by the temperature control system 175 to energize the heater elements to obtain a desired temperature.

The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluid such as those containing perfluorinated inert polyethers. While the present description describes the pedestal in the context of a PECVD processing chamber, the pedestal described herein may be used in a variety of different chambers and for a variety of different processes.

A backside gas source 178 such as a pressurized gas supply or a pump and gas reservoir are coupled to the chuck assembly 142 through a mass flow meter 185 or other type of valve. The backside gas may be helium, argon, or any gas that provides heat convection and/or cooling between the wafer and the puck without affecting the processes of the chamber. The gas source pumps gas through a gas outlet of the pedestal assembly described in more detail below to the back side of the wafer under the control of the system controller 170 to which the system is connected.

As described herein, gas may be delivered to the back side of the wafer between the top surface of the pedestal and the wafer to improve heat convection between the wafer and the pedestal. An effective radial gas flow improves gas flow across the back side of the wafer. The gas may be pumped through a channel in the base of the pedestal assembly to the top of the pedestal. The channel may include the lift pin holes. A mass flow controller may be used to control the flow through the pedestal. In a vacuum or chemical deposition chamber, the backside gas provides a medium for heat transfer for heating and cooling of the wafer during processing.

The processing system 100 may also include other systems, not specifically shown in FIG. 1, such as plasma sources, vacuum pump systems, access doors, micromachining, laser systems, and automated handling systems, inter alia. The illustrated chamber is provided as an example and any of a variety of other chambers may be used with the present invention, depending on the nature of the workpiece and desired processes. The described pedestal and thermal fluid control system may be adapted for use with different physical chambers and processes.

In this description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

Examples of different embodiments of an ESC design include a porous plug in the cooling plate for preventing plasma light-up in the helium hole.

Embodiments include the design above in which a dielectric plug is placed in a gas hole in the cooling plate.

Embodiments include the design above in which the cooling plate is conductive.

Embodiments include the design above in which the dielectric plug has a through hole or is porous allowing helium to go through it from the cooling plate into the porous plug in the top plate.

Embodiments include the design above in which the cooling plate has a fitting for a gas hole in which gas is provided below the cooling plate into a channel into the porous plug in the cooling plate.

Embodiments include the design above in which the channel in the cooling plate feeds the gas into a porous plug in the puck.

Embodiments include the design above in which the porous plug couples the gas under pressure into a hole through the top of the puck toward the wafer back side.

Embodiments include the design above in which the porous plug is made from a porous dielectric material.

Embodiments include the design above in which the porous plug is made from a porous ceramic material for example aluminum nitride (AlN) aluminum oxide ($Al_2O_3$), polyetheretherketone (PEEK), VELSEL®, or any other suitable material.

Embodiments include the design above in which the gas channel and the gas hole sidewalls in the cooling plate are covered with a dielectric coating such as aluminum nitride or yttria.

Embodiments include the design above in which the top of the cooling plate is covered with a dielectric coating such as aluminum nitride or yttria.

Embodiments include means for carrying a workpiece using an electrostatic charge that has means for gripping the workpiece, means for cooling the means for gripping, and means for conveying a cooling gas to the back side of the workpiece, the means for conveying including a porous dielectric means in the means for cooling.

Embodiments include a method for processing a workpiece using an electrostatic chuck with a top plate and a cooling plate, the method including conveying a cooling gas from the cooling plate through the top plate through a gas hole in the top plate to the back side of the workpiece, the conveying including conveying the cooling gas through a dielectric porous plug in the cooling plate.

What is claimed is:

1. An electrostatic chuck to carry a workpiece for processing, the electrostatic chuck comprising:
    a top plate to carry the workpiece, the top plate having an electrode to grip the workpiece;
    a cooling plate under the top plate to cool the top plate;
    a gas hole through the cooling plate and the top plate to feed a gas to the workpiece through the top plate, wherein the cooling plate feeds the gas into a plug in the top plate, the plug having a top surface and a tapered shape, the top surface facing away from the cooling plate, and the tapered shape inwardly tapering in a direction from the cooling plate to the top plate, wherein a portion of the gas hole extends from the top surface of the plug through the top plate; and
    an aperture-reducing plug in the cooling plate gas hole to conduct gas flow through the hole.

2. The electrostatic chuck of claim 1, wherein the aperture-reducing plug prevents plasma light-up in the gas hole.

3. The electrostatic chuck of claim 1, wherein the aperture-reducing plug is dielectric.

4. The electrostatic chuck of claim 1, wherein the cooling plate is conductive.

5. The electrostatic chuck of claim 1, wherein the plug having the tapered shape is a porous plug.

6. The electrostatic chuck of claim 1, wherein the aperture-reducing plug is made from a porous ceramic material.

7. The electrostatic chuck of claim 6, wherein the porous ceramic material comprises at least one of aluminum nitride (AlN) aluminum oxide ($Al_2O_3$), polyetheretherketone (PEEK), VELSEL®.

8. The electrostatic chuck of claim 1, wherein the aperture reducing plug further comprises a central tube to conduct gas flow through the plug.

9. The electrostatic chuck of claim 8, wherein the aperture-reducing plug is made of a solid material.

10. The electrostatic chuck of claim 9, wherein the aperture reducing plug further comprises a plurality of additional tubes to conduct gas flow through the plug.

11. The electrostatic chuck of claim 1, wherein the gas channel and the gas hole sidewalls in the cooling plate are covered with a dielectric coating such as aluminum nitride or yttria.

12. The electrostatic chuck of claim 1, wherein the top of the cooling plate is covered with a dielectric coating such as aluminum nitride or yttria.

13. A method for processing a workpiece using an electrostatic chuck with a top plate and a cooling plate, the method comprising conducting a cooling gas from the cooling plate into a plug in the top plate and through a gas hole in the top plate to the back side of the workpiece, the plug having a top surface and a tapered shape, the top surface facing away from the cooling plate, and the tapered shape inwardly tapering in a direction from the cooling plate to the top plate, wherein the gas hole extends from the top surface of the plug through the top plate, and the conducting including conducting the cooling gas through an aperture-reducing plug in the cooling plate.

14. The method of claim 13, wherein the aperture-reducing plug comprises a solid metal with a central tube to conduct gas through a hole through the cooling plate.

15. The method of claim 13, wherein the processing further comprises applying a plasma to the workpiece in a plasma chamber while conducting the cooling gas.

16. A plasma processing chamber comprising:
    a plasma chamber;
    a plasma source to generate a plasma containing gas ions in the plasma chamber; and
    an electrostatic chuck to carry a workpiece, the electrostatic chuck including a top plate to carry the workpiece, the top plate having an electrode to grip the workpiece, a cooling plate under the top plate to cool the top plate, a gas hole through the cooling plate and the top plate to feed a gas to the workpiece through the top plate, wherein the cooling plate feeds the gas into a plug in the top plate, the plug having a top surface and a tapered shape, the top surface facing away from the cooling plate, and the tapered shape inwardly tapering in a direction from the cooling plate to the top plate, wherein a portion of the gas hole extends from the top surface of the plug through the top plate, and an aperture-reducing plug in the cooling plate gas hole to conduct gas flow through the hole.

17. The chamber of claim 16, the electrostatic chuck further comprising a support plate below the cooling plate, the support plate configured to connect to a gas line to supply the gas under pressure to the gas hole.

18. The chamber of claim 16, wherein the aperture-reducing plug comprises a porous ceramic with a central tube to conduct gas flow through the cooling plate hole to the top plate.

\* \* \* \* \*